(12) United States Patent
Meyer et al.

(10) Patent No.: US 7,724,562 B2
(45) Date of Patent: May 25, 2010

(54) ELECTROCHEMICAL MEMORY WITH HEATER

(75) Inventors: Rene Meyer, Palo Alto, CA (US); Paul C. McIntyre, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 67 days.

(21) Appl. No.: 11/934,586

(22) Filed: Nov. 2, 2007

(65) Prior Publication Data

US 2008/0106929 A1 May 8, 2008

Related U.S. Application Data

(60) Provisional application No. 60/856,233, filed on Nov. 2, 2006.

(51) Int. Cl.
G11C 11/00 (2006.01)

(52) U.S. Cl. .................................. 365/148; 365/211

(58) Field of Classification Search ................ 365/148, 365/211
See application file for complete search history.

(56) References Cited

U.S. PATENT DOCUMENTS

| | | | |
|---|---|---|---|
| 5,896,312 A | 4/1999 | Kozicki et al. | |
| 5,914,893 A | 6/1999 | Kozicki et al. | |
| 6,084,796 A | 7/2000 | Kozicki et al. | |
| 6,815,744 B1 | 11/2004 | Beck et al. | |
| 7,221,579 B2 * | 5/2007 | Krusin-Elbaum et al. | ... 365/148 |
| 2005/0185444 A1 | 8/2005 | Yang et al. | |
| 2006/0050598 A1 | 3/2006 | Rinerson et al. | |

FOREIGN PATENT DOCUMENTS

| | | |
|---|---|---|
| WO | WO 00/49659 | 8/2000 |
| WO | WO 2006/029228 A2 | 3/2006 |
| WO | WO 2006/070151 * | 7/2006 |

OTHER PUBLICATIONS

Meyer, et al., *Oxygen vacancy migration and time-dependent leakage current behavior in BST thin films*, Applied Physics Letters, 86, 112904 (2005).
Nian, et al., *Evidence for an Oxygen Diffusion Model for the Electric Pulse Induced Resistance Change Effect in Oxides*, arXiv:condmat/0602507 (2006).
Szot, et al., *Switching the electrical resistance of individual dislocations in single-crystalline SrTiO*, Nature Materials, vol. 5, 312-320 (2006).
Sawa, et al., *Hysteretic current-voltage characteristic and resistance switching at a rectifying Ti/PrCaMnO3 interface*, Applied Physics Letters, vol. 85, No. 18, 4073-75 (2004).
Zhuang et al., *Novel colossal magnetoresistive thin film non-volatile resistance random access memory (RRAM)*, IEDM 193-196 (2002).

* cited by examiner

*Primary Examiner*—Hoai V Ho
*Assistant Examiner*—Jason Lappas
(74) *Attorney, Agent, or Firm*—Crawford Maunu PLLC

(57) ABSTRACT

Non-volatile resistance change memories, systems, arrangements and associated methods are implemented in a variety of embodiments. According to one embodiment, resistance-change memory devices are implemented having a pair of electrodes and an intervening electrochemical material. A heating element facilitates changes in resistance of the electrochemical material-region due to changes in ion distribution. The method is implemented without a process for forming a filament-like region in the electrochemical material.

20 Claims, 7 Drawing Sheets

ELECTROCHEMICAL MEMORY WITH HEATER

RELATED PATENT DOCUMENTS

This patent document claims the benefit, under 35 U.S.C. §119(e), of U.S. Provisional Patent Application No. 60/856,233 filed on Nov. 2, 2006 and entitled: "Electrochemical Memory With Active Heater," which is fully incorporated herein by reference.

FIELD OF THE INVENTION

The present invention relates generally to resistance-change memories and more particularly to resistance-change memory devices and methods of using and manufacturing resistance-change memory devices.

BACKGROUND

Memory devices are often categorized by their ability to retain data over time. For example, memory devices are considered to be volatile if they retain data while powered and, conversely, the data is lost when power is no longer provided. Static random access memory (SRAM) and dynamic random access memory (DRAM) are examples of volatile memory devices. Although losing data in response to a power loss is disadvantageous, such volatile memory devices permit relatively fast random data access (i.e., reading and/or writing).

Another category of memory device is referred to as non-volatile because they store information even after the memory is disconnected from a power source. Non-volatile memory devices typically provide slower data access and are exemplified by the read only memory (ROM), the electrically erasable programmable read only memory (EEPROM), and the FLASH memory. FLASH memory devices are used in a variety of applications including, for example, personal computers, cell phones, memory sticks, personal digital assistants (PDAs), digital cameras, microcomputer chips, wireless transmitters and receivers, and smart cards.

There have been ongoing efforts to design memory devices that are non-volatile but that also realize the access-time advantages of the volatile type. Many of these efforts have been driven by ongoing needs to reduce the size of the memory devices (i.e., the size of the cells within and/or feature sizes thereof), to reduce power requirements, and/or to increase data-access time. With regards to size reduction, for example, current semiconductor manufacturing efforts can implement the smallest features using 65 nm technology, and ongoing physical scaling efforts for such memory devices are expected to realize their physical scaling limit in the range of the 45 nm to 32 nm technology node. There are several candidates for less-volatile (and/or non-volatile) memory devices that realize one or more of these advantages. Among these candidates is the resistance-change memory.

The nonvolatile resistance-change memory typically stores information as logic bits (logic "1" and logic "0") as a "high" or a "low" resistance state of the memory cell. This type of memory includes a electrochemical material separating two electrodes (e.g., a metal-insulator-metal structure), and a bit of data is stored and/or altered by changing the conductivity of the electrochemical material so that the resistance between the electrodes exhibits at least two different states, including a high-resistance state and a low-resistance state.

A resistance-change memory (RCM or RRAM), which can also be referred to as phase-change RAM or an electrochemical RAM, operates based on the intrinsic formation of a conductive filament-like region in the electrochemical material. In such filamentary memories, the resistance change effect is local and situated close to or inside the filament-like region. However, the filamentary nature of the memory effect itself is a disadvantage of all filamentary based memories, since this memory class does not scale well in relation to area or thickness. It remains therefore questionable, whether filamentary-based memories can be commercialized. A disadvantage of PCRAM is the large current consumption of the memory during program/erase operations.

At a more detailed level, such filamentary-based memories are commonly composed of a metal-insulator-metal structure. The insulator (or dielectric) is a binary oxide (e.g., $NiO_2$, $TiO_2$ or $Al_2O_3$), a more complex oxide (e.g., perovskites $ABO_3$, $SrTiO_3$, $SrZrO_3$, $BaTiO_3$ or $BaSrTiO_3$), or chalcogenide (e.g., $Cu_2S$, $AgS$ or $ZnCdS$). In terms of its operation, initially, the insulator exhibits a high resistance and does not show any memory effect. Before the insulator is used as a memory device (e.g., NVRAM), a conductive filament-like region is formed within the insulator by a high-voltage forming process. The filament-like region is developed by applying a voltage close to the break down voltage across the insulator for an extended period of time. This process is also referred to as "the formation process" or "the forming process."

The filament-like region can be regarded as an incomplete local breakdown of the material. In many cases, a current compliance on the programming pulse has to be used to prevent a complete breakdown. If and where the filament-like region forms is strongly correlated with the location and number of crystallographic defects in the electrochemical material. As a result, filament-like regions are often randomly distributed in the electrochemical material.

Once the filament-like region is formed, the memory effect of resistance-change memory is based on a local redistribution of mobile ions or ion vacancies by a voltage pulse of positive or negative polarity (program or erase pulse) via the electrodes. A change in the ion spatial distribution is related to a change of the electronic conductivity. A variation of the electrode area shows that the resistance change in these devices is a local effect and that the effect is coupled to the conductive filament-like region(s).

The resistance change of the memory is caused by a local redistribution of ions or ion vacancies. Mobility of ions and/or ion vacancies in binary and complex oxides is thermally activated. At room temperature, the mobility of ions and vacancies is low so that large fields close to the dielectric break down field are needed to change the ion profile. At elevated temperatures of 150° C. to 300° C., the mobility has increased and ions can easily be moved at least small distances (in terms of nanometers) within µs time scales and under significantly reduced electric fields.

Due to its low resistance, the conductive filament-like region can dissipate significant heat. During program and erase operation, the filament-like region acts as a resistive heater, which causes a self-heating of the memory cell. The filament-like region provides thermal energy for the migration of ions in the vicinity of the filament and may also provide an easy diffusion path for ions at program/erase temperatures.

One advantage of filamentary type memories is good data retention. Both high and low resistance states are stable for several years (typically at least 10 years) and can be readout without losing the stored information (i.e., non-destructively).

Such filament-based memories present a number of challenges to be overcome before successful commercialization. Their requirement of a forming process is an impediment to the manufacturing process. These memories also exhibit an uncontrolled filament-like resistance, a drift of the filament resistance with the number of program/erase cycles (aging of the cell), and an undefined active memory area in the memory cell. Further, at least partly due to their undefined active memory area in the cell, these devices have exhibited a poor scaling behavior. In addition, mainly due to a change of the filament-like region resistance with ongoing usages of the devices, their implementations have been disadvantaged by a shift in the program/erase voltage, a drift in the "on"-resistance and the "off"-resistance, and low-cycling endurance. Various changes of the electrical properties of the filament-like region, perhaps attributable to its random formation and nature (one dimensional lattice defect), present further challenges.

SUMMARY

In various embodiments, the present invention is directed to resistance-change memory devices, methods of using and manufacturing resistance-change memory devices, and/or to such devices and methods that overcome one or more of the above-mentioned challenges with filament-based memory devices. The present invention is exemplified in a number of implementations and applications, some of which are summarized below.

According to one aspect, the present invention is directed to resistance-change memory devices (and such methods of using and manufacturing these devices) having a pair of electrodes and an intervening electrochemical material, where heat facilitates changes in resistance of the electrochemical material-region without a process for forming a filament-like region in the electrochemical material.

According to another aspect, the present invention is directed to resistance-change memory devices (and such methods of using and manufacturing these devices) having a pair of electrodes, a electrochemical material separating the electrodes and having a local region being responsive to heat, and a heater that is separate from and adjacent to the local region to generate heat in the local region wherein a resistance change is effected across the electrodes to alter a memory state of the device.

Other aspects of the present invention are directed to systems and circuits including resistance-change memory devices of the type characterized above. These systems and circuits include, without limitation, personal computers, cell phones, memory sticks, personal digital assistants (PDAs), digital cameras, microcomputer chips, wireless transmitters and receivers, and smart cards.

Other implementations, which are also consistent with the present invention, closely track with approaches using filamentary approaches but which use a linear or non-linear heating element in lieu of a filament-like region.

The above summary of the present invention is not intended to describe each illustrated embodiment or every implementation of the present invention. The figures and detailed description that follow more particularly exemplify certain embodiments.

BRIEF DESCRIPTION OF THE DRAWINGS

The invention may be more completely understood in consideration of the detailed description of various embodiments of the invention that follows in connection with the accompanying drawings, in which.

Figure 1:
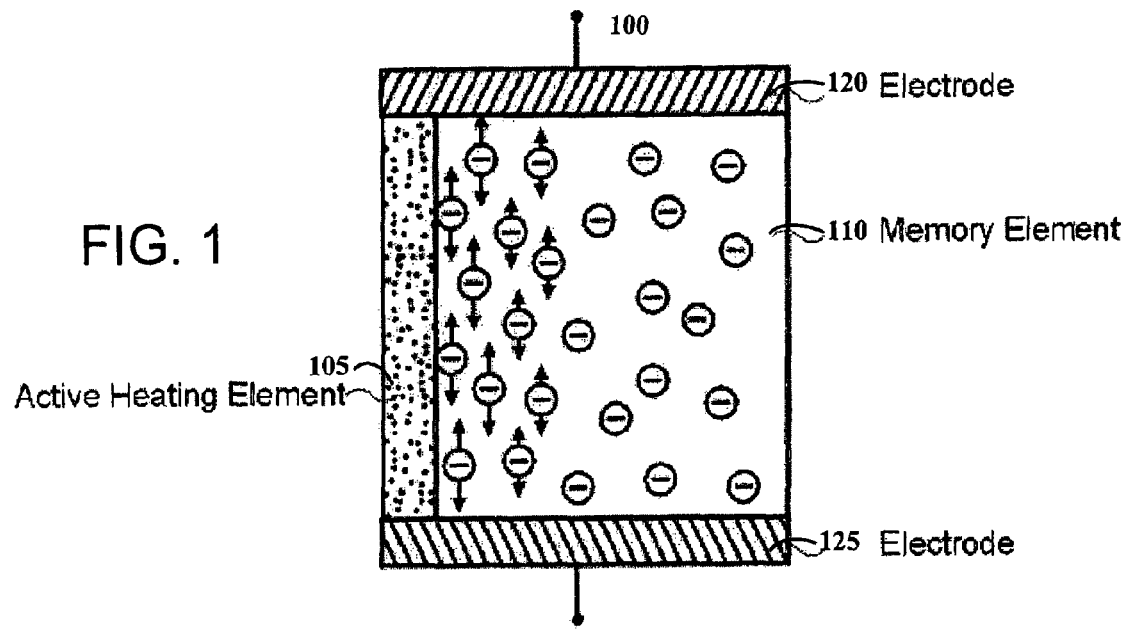
FIG. 1 depicts a block diagram, from a cross-sectional perspective, of a resistance-change (electrochemical-based) memory cell, according to one example of the present invention.

While the invention is amenable to various modifications and alternative forms, specifics thereof have been shown by way of example in the drawings and will be described in detail. It should be understood, however, that the intention is not necessarily to limit the invention to the particular example embodiments described and claimed. On the contrary, the intention is to cover all modifications, equivalents, and alternatives falling within the spirit and scope of the invention.

DETAILED DESCRIPTION

The present invention is believed to be useful for a variety of different applications involving non-volatile resistance-change memories, and the invention has been found to be particularly suited for improving the reliability and predictability of resistance change memories based on solid state electrolytes. While the present invention is not necessarily limited to such applications, various aspects of the invention may be appreciated through a discussion of several examples using this context.

According to an example embodiment of the present invention, an electronic circuit, such as CPU-based circuit, includes a memory cell (e.g., as part of a memory register or memory array) constructed in accordance with the present invention. By using an heating element, this embodiment can be useful in avoiding the complicated formation process of the filament-like region and the afore-discussed problems associated with such filament-like region are avoided. The resistance-change memory device includes at least one memory cell having a pair of electrodes, a electrochemical material separating the electrodes and having a local region being responsive to heat, and a heater that is both separate from and adjacent to the local region. By applying an external electric field across the electrodes, a concentration change of electronic charge carriers causes an increase or decrease in the resistance of the memory cell; for example, during one memory access such as a programming operation, a concentration gradient of ions builds up. The heater generates heat in the local region which, in turn, facilitates ionic mobility to help effect a resistance change across the electrodes to alter a memory state of the device.

In a more specific implementation, the heater has a non-linear current-voltage characteristic that is used to decouple program/erase and read operations of the memory cell. Various different non-linear heater elements can be implemented including, but not limited to Schottky-diode, pn-junction, tunnel junction or a semiconductor region with ohmic contacts. These devices can be manufactured from various semiconductor materials including, but not limited to, Si, Ge, conductive materials and/or semi-conductive oxides. In a related embodiment, a combination of a non-linear semiconductor element and a linear heater element (in series) is used. In this instance, the heater includes a linear portion (e.g., a highly resistive metal or metal alloy) and a non-linear portion (e.g., a doped semiconductor).

In various applications, the resistance-active area can be tailored by design parameters of the cell and the heater. These design parameters include, for example, types of materials selected for the electrochemical material, the locations of the heater, and the manner in which the heater is controlled.

FIG. 1 depicts a block diagram, from a cross-sectional perspective, of a resistance-change memory cell according to one example embodiment of the present invention. The memory cell 100 employs a heating element 105 adjacent to electrochemical memory element 110 for effecting a resistance change across electrodes 120 and 125 and thereby enhancing ionic mobility in altering a memory state of the memory cell 100. The memory element 110 is a solid state electrolyte material having one of various compositions (for example, as described above for previous filamentary-based memory elements and including, but not limited to one or more of titanium oxide, nickel oxide, copper sulphide or Yttria Stabilized Zirconia). The localized heat, nearest the heating element 105, is used to enhance the mobility of ions. The ions concentration in this heater-local region is increased in response to the application of an external electric field across the electrodes and the heat generated from the heating element 105. The heating element 105 can be controlled (activated) to generate such heat in various ways as may be needed for the memory application.

The mobility of ions in the above-described embodiment is exemplified in an application where the memory cell 100 of FIG. 1 is used in place of a FLASH memory cell. During the program and erase operation, for example, the application of an external electric field across the electrodes can be used to activate the heating element 105 which dissipates heat to the memory cell. The mobility of ions close to the heating element 105 significantly increases and allows ions to redistribute under the external electric (program/erase) field. After the program/erase voltage pulse (e.g., as applied to the electrodes), the ion mobility is sufficiently reduced to hinder ions from moving back to their equilibrium position.

Embodiments with a non-linear current-voltage characteristic of the heating element 105 can be particularly useful for reducing the read disturb (degradation of memory element) and the power consumption during the read operation.

The heating element 105 is preferably composed of a material that can endure many heating cycles without degradation. A few examples of suitable materials include, but are not limited to, TiN, TiAlN, TaSiN. In this manner, the heating element 105 is physically different (e.g., formed from a different material) from the local region for which heat from the heater aids in effecting a resistance change across the electrodes and altering a memory state of the device. Due to the heat being generated by the heating element rather than by the local region, the effect of repeated heat-based cycling can have less of an adverse effect on the local region. For example, the local region, including filaments therein, need not source the electrical current required to generate the heat. This can be useful for reducing the electrical power dissipated in the local region due to a memory program operation.

In variations of the above, the heater and memory cell can be connected in parallel. A separate electrical connection of memory element and heater element can be useful in certain memory arrays having atypical data/word lines.

Figure 2:
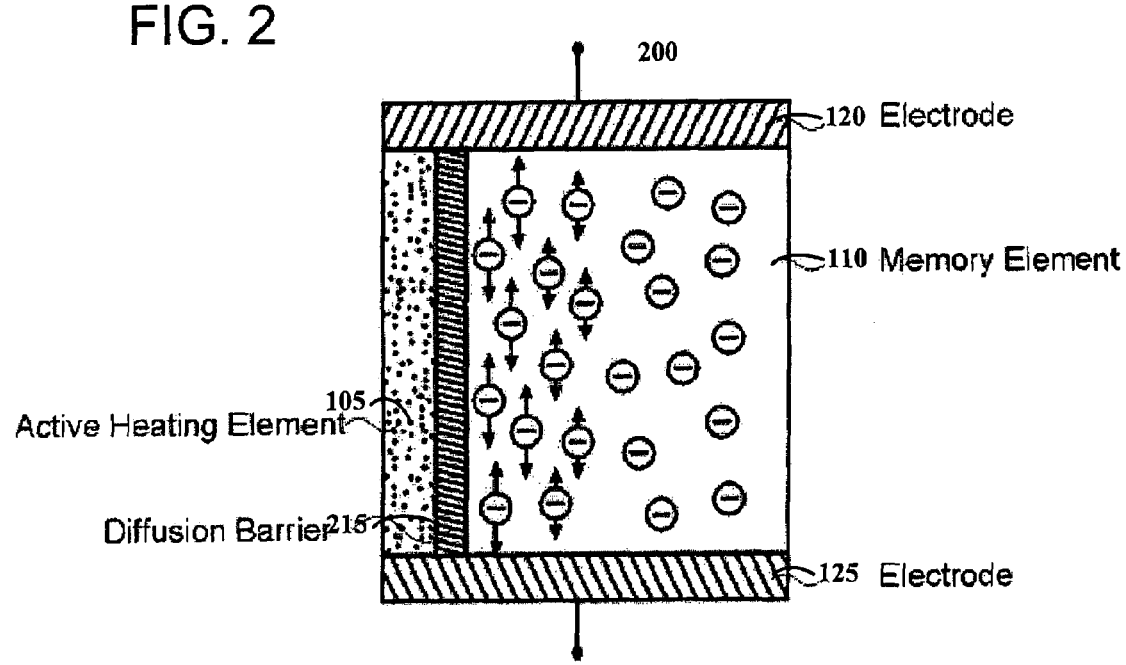
FIG. 2 depicts a block diagram of another resistance-change memory cell including a diffusion barrier, according to another example of the present invention.

According to another embodiment of the present invention, FIG. 2 depicts a block diagram of another resistance-change memory cell 200 that includes a diffusion barrier 215 between the electrochemical memory element 110 and the heating element 105. The diffusion barrier 215 helps to circumvent chemical reactions of the heating element 105 and the solid state electrolyte material of the memory element 110.

Figure 3A:
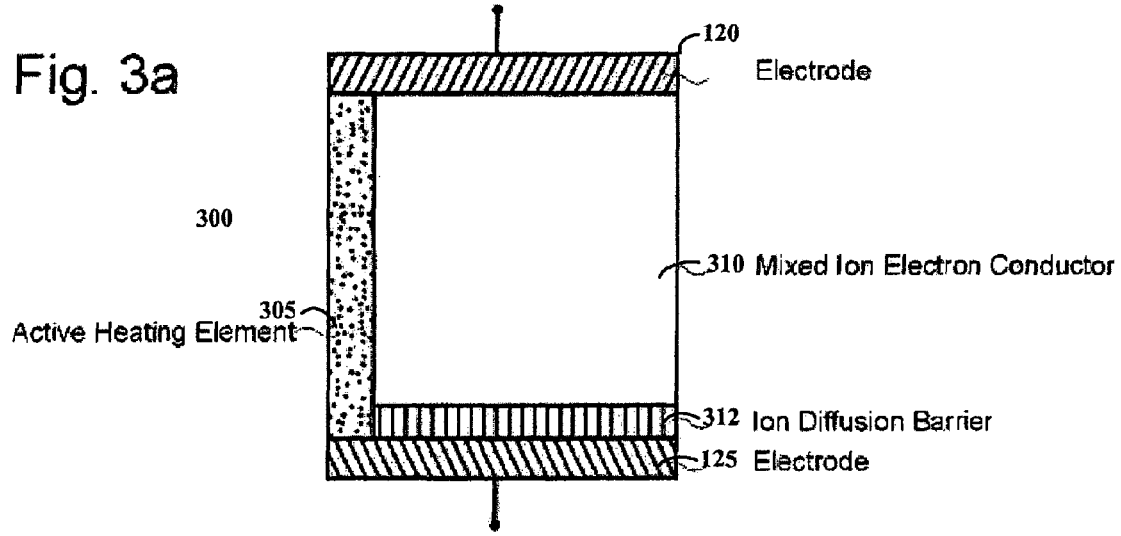
FIGS. 3A and 3B depict block diagrams of other resistance-change memory cells, each cell also including a diffusion barrier, according to other examples of the present invention.
Figure 3B:
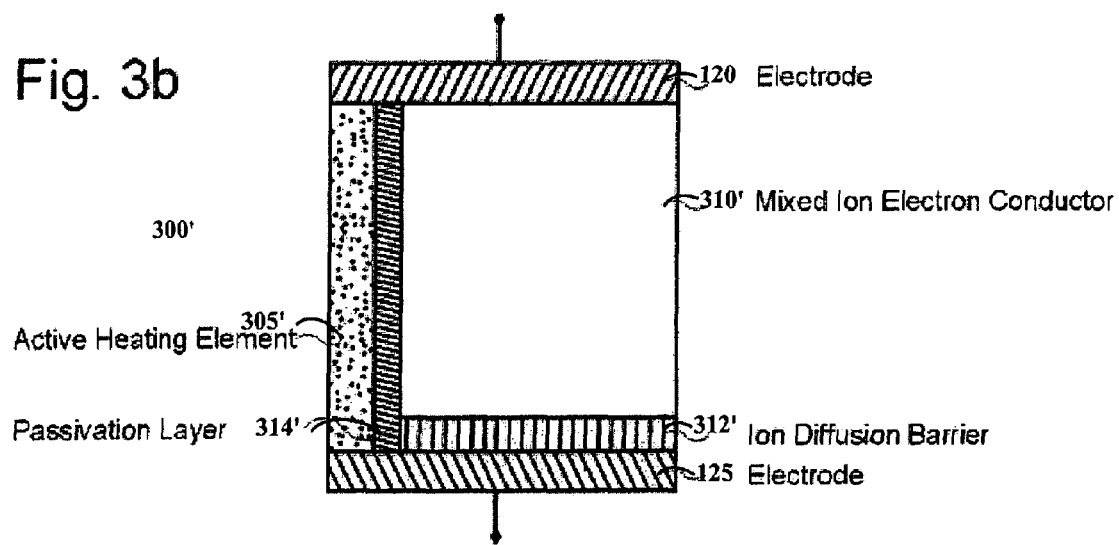

In accordance with other embodiments of the present invention, FIGS. 3A and 3B illustrate memory elements 300 and 300' being composed of different layers. These layers include a memory element 310 (310') in the form of a mixed ion electron conductor, and an ion diffusion barrier 312 (312'). The ion diffusion barrier can be an electron conductor layer or other such layer/material, for inhibiting the flow of ions onto the electrode and acting as a diffusion barrier for ions, thereby preventing migration of ions through the electrode and a loss of ions in the memory element 310.

Mixed ion electron conductors are solids with a high mobility of ions or ion vacancies. The high mobility of ions/vacancies gives rise to ionic motion. At the same time, a sufficiently high concentration of electrons or defect electrons causes an electronic conduction. One of the properties of a mixed electronic ionic conductor is that a change in the ionic/vacancy concentration is correlated with a change in the concentration of electrons or electron holes. Thus, changes in the electronic concentration affect the overall conductivity of the material. The mixed ionic electronic conductor is sometimes referred to as a "solid state electrolyte." Since the memory mechanism of the present invention can be implemented in a manner that is similar for solid state electrolytes with ionic and ion vacancies conduction, similar considerations can be applied to solid state electrolytes of predominantly ion conduction where, as illustrated in connection FIGS. 3A and 3B, the memory element 310 can be heated for memory operation as described above.

FIG. 3B also shows a passivation layer 314 acting to mitigate chemical reactions as discussed above in connection with FIG. 2. In some instances, the passivation layer can be useful for reducing chemical reactions between the heater and the memory layer. This can be particularly useful when heater and memory material are not inert and therefore may react to one another thereby reducing the memory performance. The passivation layer can also be useful as a diffusion barrier to prevent a loss of ions in the memory material during program/erase operation.

Figure 4A:
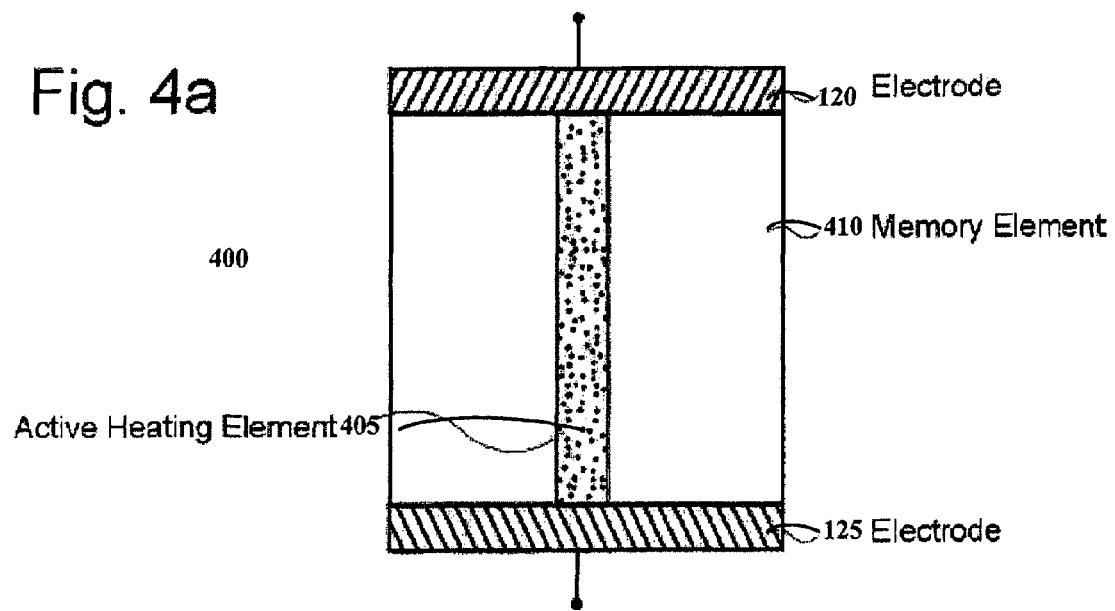
FIGS. 4A and 4B depict block diagrams of other resistance-change memory cells according to yet other examples of the present invention.
Figure 4B:
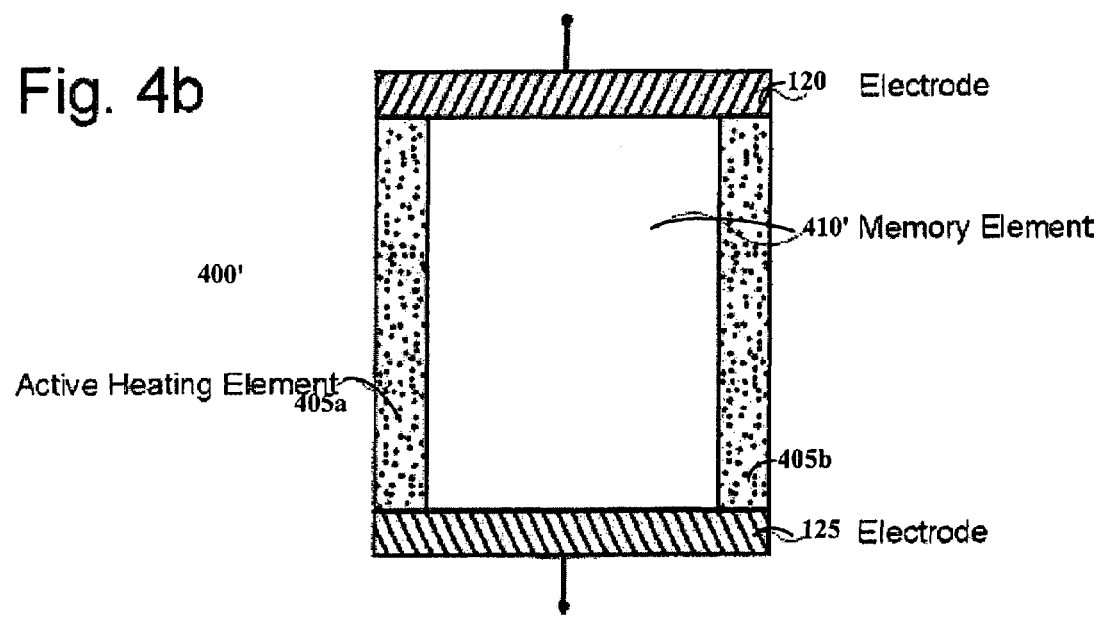

FIGS. 4A and 4B show different realizations for such a resistance-change memory cell, also according to the present invention. These different realizations allow memory cells 400 and 400' to be tailored in the memory active area of the cell and to scale the memory cell. In FIG. 4A, memory element 400 includes heating element 405 located in a relatively central region. By more centrally locating the heating element 405 as such, ionic concentration occurs on both sides of the heating element 405. In FIG. 4B, memory element 400' includes two heating elements 405a and 405b located at opposite sides of the memory element 410'. Both approaches (FIGS. 4A and 4B) enhance ionic concentration by heating two regions of the memory element rather than one.

Figure 5A:
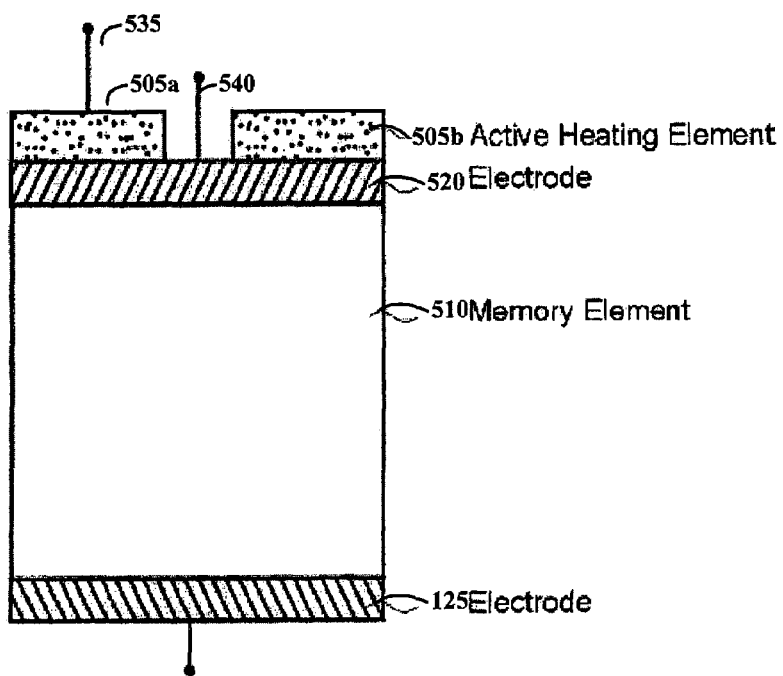
FIGS. 5A and 5B depict block diagrams of alternative electrochemical memory cells with respective heaters being responsive to dedicated voltage-controllable electrodes, also in accordance with examples of the present invention.
Figure 5B:
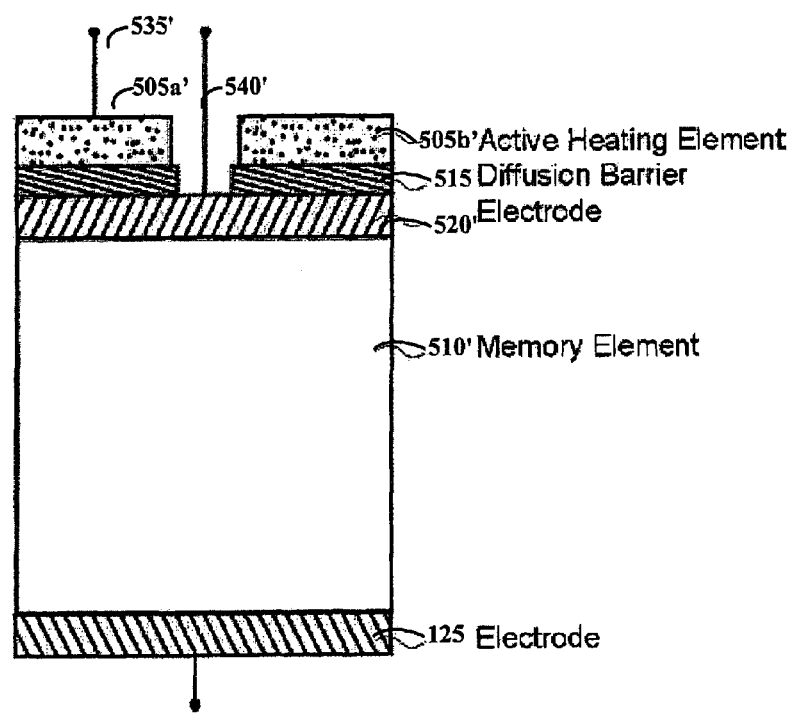

FIGS. 5A and 5B depict block diagrams of alternative electrochemical memory cells, also in accordance with examples of the present invention. Each of these embodiments include respective multiple heating elements 505a and 505b of FIG. 5A and 505a' and 505b' of FIG. 5B. In each embodiments, the heating elements are respectively adapted for connection to separate (voltage-) controllable signals via electrode 535 (535') and electrode 540 (540'), the latter of which is also used to present the control voltage to the main electrode 520 (520') for the memory element 510. Further, FIG. 5B includes a diffusion barrier 515 serving to mitigate chemical reactions as discussed previously. As also discussed previously, by using two such heating elements, ionic mobility is enhanced in two regions, each region being local to the associated heating element.

This type of design shown in FIGS. 5A and 5B allows ions to redistribute beneath the electrode only. The memory effect then scales with the area of the electrode.

For random access (multiple-memory-cell) applications, each memory cell has an individual heater. Other configurations have one heater for a number of memory elements (parallel write/parallel erase).

Accordingly, various embodiments of the invention address problems related to resistance-change memories. Some of the embodiments can be useful for providing one or more of the following advantages: no formation process is required; well defined electrical characteristics are provided by the heater element; there is no drift (aging) of the heater resistance, thereby yielding significant program/erase cycling endurance; scalability of the memory cell is realized; scaling of "on" and "off" resistance with electrode area is realized; fast program/erase cycle and good data retention is realized; the resistance state is not disturbed during read operation; there is no critical cell size (below which no filament can be formed, e.g., due to crystal imperfections); and control and tailoring of the program/erase voltage is provided.

For implementing the active memory element of the memory cell, such as 110 of FIG. 1, a variety of materials can be used. These materials include, but are not limited to, Perovskites (such as Titanates, Manganates, Zirconates), binary oxides (such as $TiO_2$, $NiO_2$), sulfides (such as $Cu_2S$) and other solid state electrolytes. Combinations of such materials and multiple layers of these materials are also possible.

In a specific embodiment, the heating element (such as 105 of FIG. 1) is a low-resistance or electrically-conductive material such as conductive ceramic-based materials, a highly-doped silicon, or other semiconductor material, having such comparable electrically-conductive properties.

Figure 6A:
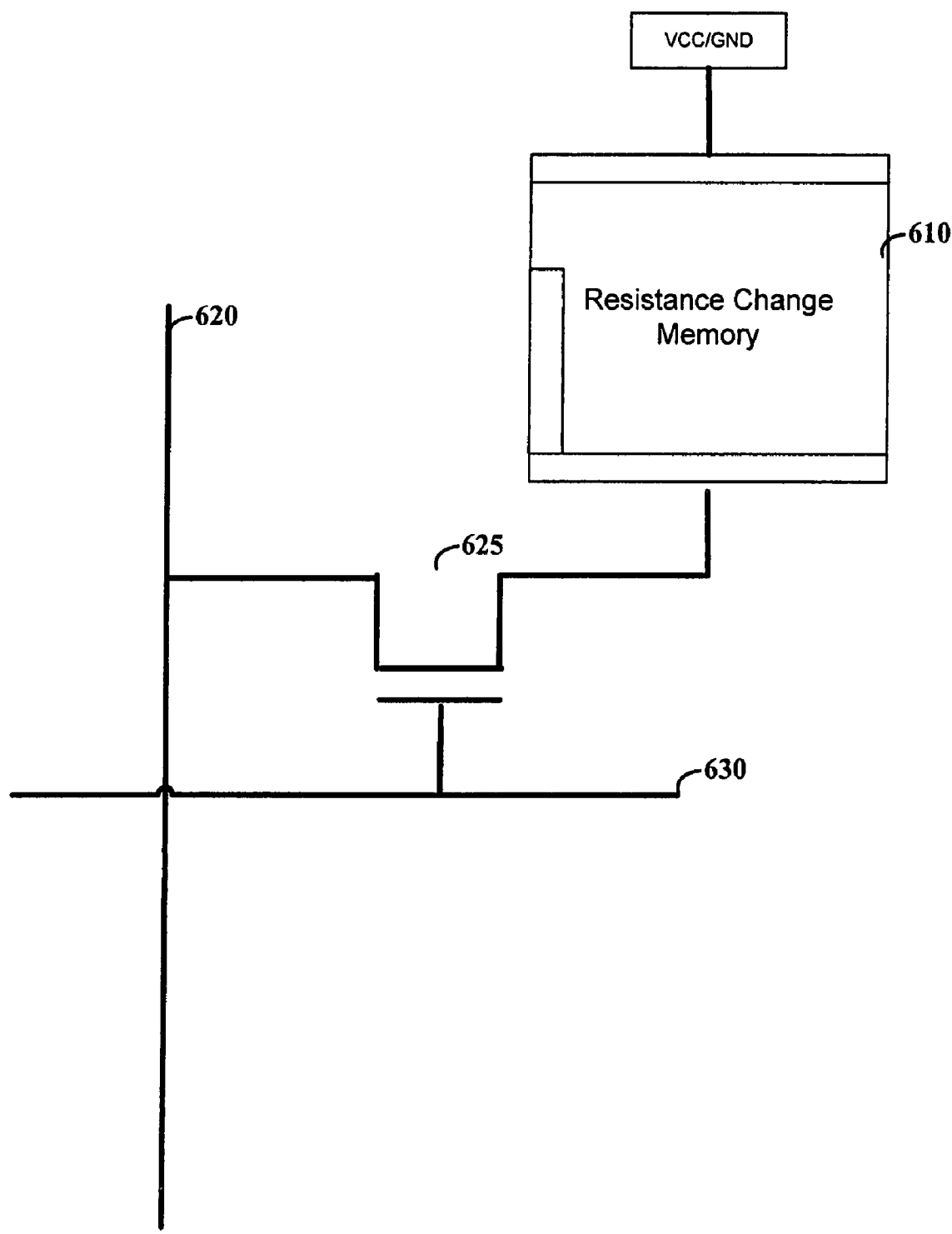
FIG. 6a depicts a block diagram of a memory cell used in an example memory array, according to another aspect of the present invention.

Industrial applicability of the embodiments consistent herewith is diverse. In certain applications, these embodiments supersede and/or replace FLASH memory devices, which is also advantageous in light of FLASH soon reaching physical scaling limits. For example, as depicted in the circuit diagram of FIG. 6a, a memory cell 610 (according to one of the above-described embodiments) can be used in place of many currently-implemented storage elements as part of a memory array. This circuit diagram of FIG. 6 shows memory cell 610 as a representative cell accessed (for read and program/erase operations) by a representative data/bit line 620 and by a representative word line (or address bit) 630. The word line (or address bit) 630 is used to control the gate of the access transistor 625 which has its S/D connected to data/bit line 620 and its D/S connected to one of a memory control electrode of the memory cell.

Figure 6B:
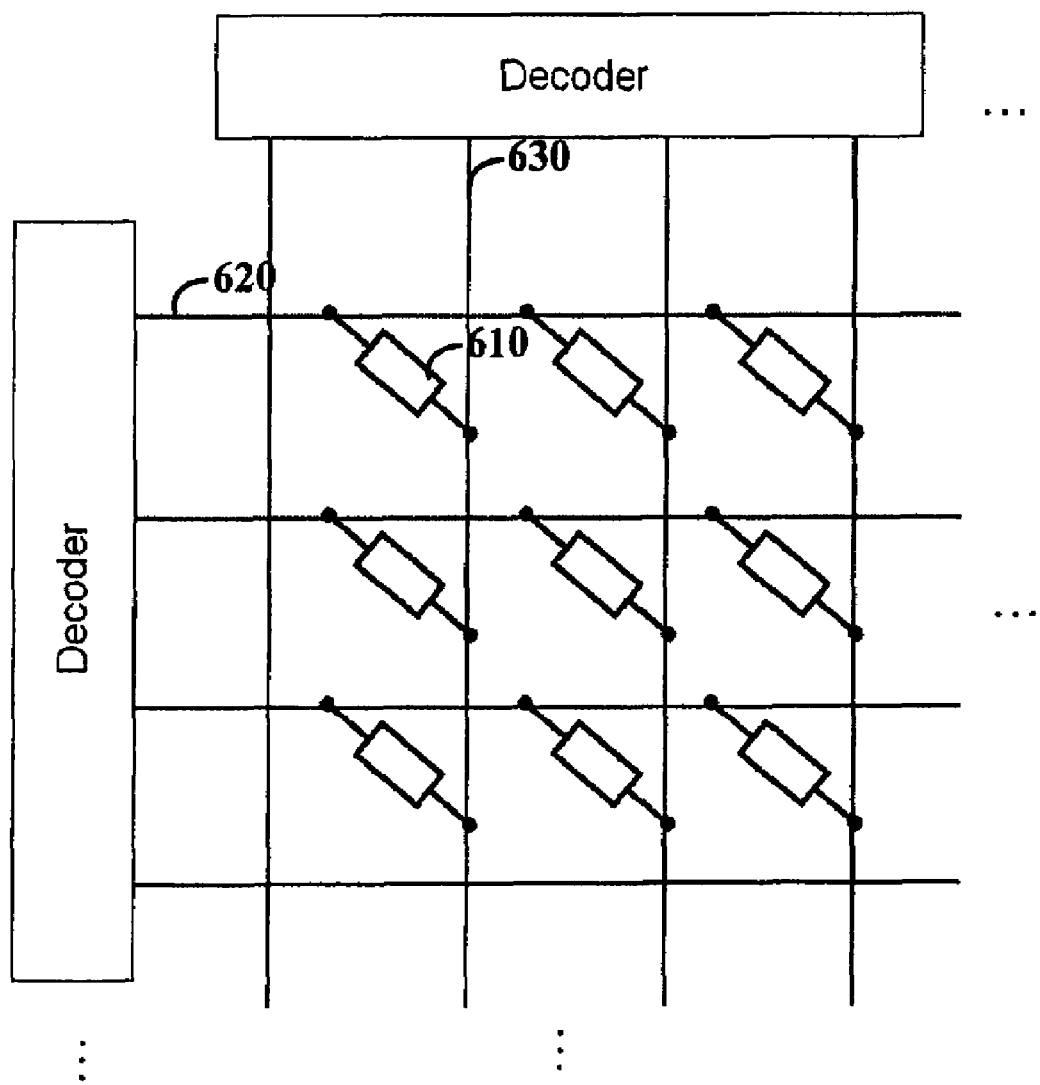
FIG. 6b depicts a block diagram of memory cells used in another example memory array, according to another aspect of the present invention.

FIG. 6a is merely one example access circuit and is not meant to be limiting. There are a number of different access circuits that can be used in conjunction with embodiments of the present invention. The access circuit need not contain a transistor or similar semiconductor device at each memory location. For example an array, such as a crosspoint array, may include column and row decoders located on the periphery of the access the memory element(s). FIG. 6b shows an example of such an array. Decoders select the proper row and column lines (620 and 630) in order to access the selected the memory cell (610). In this manner the decoders provide read or write access to a memory element using a row and column that each intersect with the desired memory element(s). Various other implementations are also possible, but have been omitted for the save of brevity.

Figure 7:
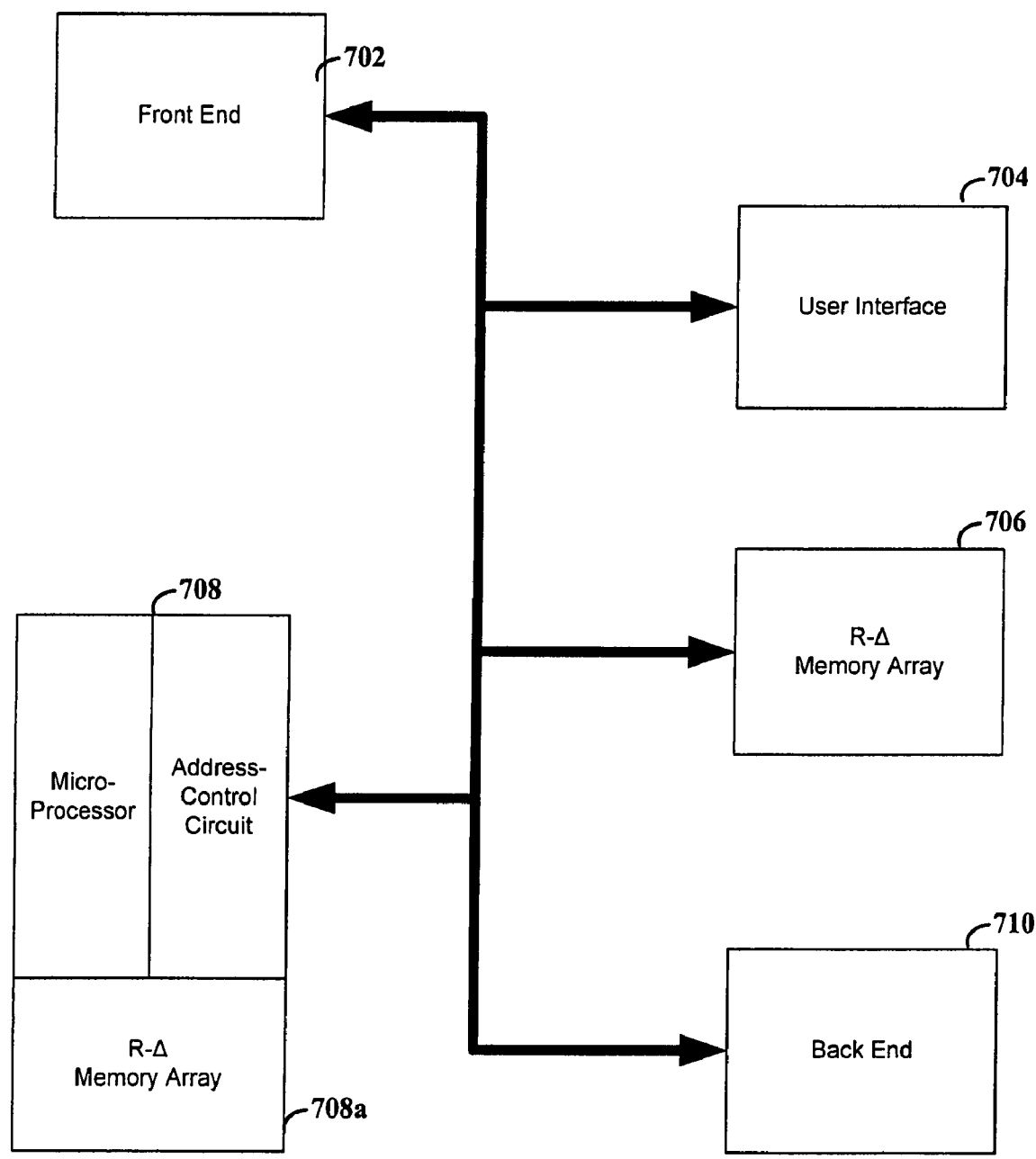
FIG. 7 depicts a block diagram of a circuit arrangement, according to other aspects of the present invention, using memory cells and memory circuits implemented in a manner consistent with the present invention.

As depicted in the circuit block diagram of FIG. 7, embodiments consistent herewith are useful both in stand alone and in embedded applications. Prominent applications are non-volatile memories in computers, cell phones, memory sticks, PGA'S, digital cameras, smart cards, etc.

FIG. 7 illustrates any of a variety of such applications where a resistance change memory (according to one of the above-described embodiments) is used as an embedded memory at 708a and/or as a stand alone circuit or chip as depicted in an array at 706. The microprocessor 708 can directly access the embedded memory 708a. Microprocessor 708 can included and address control interface for accessing the front-end and back-end circuits 702 and 710 (optionally included, based on the application). In a particular instance, front-end and back-end circuits 702 and 710 represent signal processing input and output stages, respectively. Examples of such stages include receiver and transmitter stages of a wireless device such as a cellular telephone. A user interface 704 (e.g., display and input devices) can also be implemented is so desired.

In one embodiment, the embedded memory 706/708a can include control logic that allows the memory to interface with existing technology. Such control logic can control the voltages supplied to the devices to allow for selective memory accesses including reads and writes.

The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. For example, it would be appreciated that operational and/or structural aspects (e.g., active regions, barriers and electrode nodes) of the embodiments described in connection with FIGS. 1 through 5b can be combined to implement modified embodiments useful for applications such as those exemplified in FIGS. 6 and 7. Such modifications and changes do not depart from the true spirit and scope of the present invention, which is set forth in the following claims.

What is claimed is:

1. A memory cell having resistive states that change as a function of ion distribution within the cell, the states responsive to control signals, comprising:
    a first electrode;
    a second electrode;
    a electrochemical material disposed electrically between the first and second electrodes and having a local region with an ion distribution that is responsive to voltage applied at the first and second electrode; and
    a heater that is separate from and adjacent to the local region, and that is responsive to a control signal, the heater providing heat to the local region, thereby facilitating a change in the ion distribution.

2. The memory cell of claim 1, wherein the electrochemical material has a majority of ions of a first polarity type, and wherein the heater is controlled by voltage to promote migration of the ions.

3. The memory cell of claim 1, wherein the heater layer includes a heat producing layer and a diffusion barrier that separates the heat producing layer from the electrochemical material.

4. The memory cell of claim 3, wherein the diffusion barrier and the heat producing layer are immediately adjacent one another.

5. The memory cell of claim 1, wherein the control signal is connected to, and provided by a voltage applied to, one of the first and second electrodes.

6. The memory cell of claim 1, wherein the heater has non-linear current-voltage characteristics.

7. The memory cell of claim 1, wherein the heater and the electro chemical material are formed from substantially different materials, respectively.

8. The memory cell of claim 1, wherein the heater electrically connects to both the first and second electrodes.

9. The memory cell of claim 1, wherein a first side of the heater connects to one of the first and second electrodes and not to the other of the first and second electrodes and a second side of the heater connects to a third electrode.

10. The memory cell of claim 1, wherein the heater heats the local region concurrent with an electric field across the electrodes and wherein a resistance value across the first and second electrodes is altered by movement of ions in the local region without first forming a filament-like region in the electrochemical material.

11. A memory cell, comprising:
a first electrode;
a second electrode;
a electrochemical material disposed electrically between the first and second electrodes and having a local region with an ion distribution that is responsive to voltage applied at the first and second electrode;
means for heating that is separate from and adjacent to the local region; and
means, disposed electrically between the first and second electrodes and responsive to said heating means, for altering a memory state of the cell without first forming a filament-like region in a electrochemical material of the means disposed between the first and second electrodes.

12. A method for manufacturing a memory cell, comprising:
forming at least two electrodes and a electrochemical material, the electrochemical material
being composed of a first material type, and
being electrically coupled to the electrodes; and
forming a heater, composed of a second material type that is different from the first material type, adjacent to and electrically coupled to the electrochemical material disposed electrically between the electrodes wherein the electrochemical material responds to an electric field across the electrodes and the heater by altering a memory state of the cell.

13. The method of claim 12, wherein the step of forming a electro chemical material having a local region that responds to the heater by altering a memory state of the cell does not include adapting the local region to form a filament-like region in the electrochemical material.

14. A method of using a memory cell having a electrochemical material disposed electrically between first and second electrodes and having a local region being responsive to heat for altering a memory state of the cell, the method comprising:
without first forming a filament-like region in the electrochemical material, applying an electric field across the electrodes and concurrently heating the local region to alter a memory state of the cell.

15. A memory array having a multitude of memory cells, each memory cell comprising:
a first electrode; a second electrode;
a electrochemical material disposed electrically between the first and second electrodes and having a local region; and
a heater that is separate from and adjacent to the local region, wherein in response to application of an electric field across the electrodes and heat concurrently generated in the local region, resistance states across the first and second electrodes of the cell is altered by way of a ion movement in the local region.

16. A method comprising:
providing a memory cell having electrochemical material disposed electrically between first and second electrodes, the electrochemical material having a local region being responsive to heat for altering a memory state of the memory cell, the memory cell being susceptible to formation of a filament-like region in the electrochemical material capable of altering the memory state of the memory cell responsive to an electric field being applied across the first and second electrodes, the method comprising:
applying the electric field across the first and second electrodes; and
using a local heater that is separate from the electrochemical material and adjacent to the local region, heating the local region and thereby altering the memory state of the memory cell while preventing formation of the filament-like region in the electrochemical material.

17. The method of claim 16, wherein heating the local region alters a resistance value across the first and second electrodes thereby altering the memory state of the memory cell.

18. The method of claim 16, wherein heating the local region causes movement of ions in the local region thereby altering the memory state of the memory cell.

19. The method of claim 16, further comprising applying a voltage at the first and second electrodes to control heating of the local region using the local heater.

20. The method of claim 16, wherein the steps of applying the electric field and heating the local region are performed concurrently.

* * * * *

UNITED STATES PATENT AND TRADEMARK OFFICE
CERTIFICATE OF CORRECTION

PATENT NO. : 7,724,562 B2
APPLICATION NO. : 11/934586
DATED : May 25, 2010
INVENTOR(S) : Meyer et al.

It is certified that error appears in the above-identified patent and that said Letters Patent is hereby corrected as shown below:

Col. 9, line 20, Claim 7: "electro chemical" should read --electrochemical--.

Col. 10, line 2, Claim 13: "electro chemical" should read --electrochemical--.

Signed and Sealed this

Twenty-first Day of December, 2010

David J. Kappos
*Director of the United States Patent and Trademark Office*